US010586651B2

(12) United States Patent
Goelzhaeuser et al.

(10) Patent No.: US 10,586,651 B2
(45) Date of Patent: Mar. 10, 2020

(54) METHOD OF MANUFACTURE OF A MULTILAYER STRUCTURE

(71) Applicant: CNM Technologies GmbH, Bielefeld (DE)

(72) Inventors: Armin Goelzhaeuser, Bielefeld (DE); Andre' Beyer, Bielefeld (DE); Paul Penner, Bielefeld (DE); Xianghui Zhang, Bielefeld (DE)

(73) Assignee: CNM TECHNOLOGIES GMBH, Bielefeld (DE)

(*) Notice: Subject to any disclaimer, the term of this patent is extended or adjusted under 35 U.S.C. 154(b) by 0 days.

(21) Appl. No.: 16/270,015

(22) Filed: Feb. 7, 2019

(65) Prior Publication Data

US 2019/0228910 A1 Jul. 25, 2019

Related U.S. Application Data

(63) Continuation-in-part of application No. 15/322,131, filed as application No. PCT/EP2015/064562 on Jun. 26, 2015, now Pat. No. 10,229,786.

(30) Foreign Application Priority Data

Jun. 26, 2014 (GB) .................................. 1411334.4

(51) Int. Cl.
*H01G 4/008* (2006.01)
*C01B 32/186* (2017.01)
(Continued)

(52) U.S. Cl.
CPC ................. *H01G 4/08* (2013.01); *B32B 9/00* (2013.01); *C01B 32/186* (2017.08); *G03F 7/162* (2013.01);
(Continued)

(58) Field of Classification Search
None
See application file for complete search history.

(56) References Cited

U.S. PATENT DOCUMENTS 8,377,243 B2    2/2013  Gölzhäuser et al.
9,105,406 B2*   8/2015  Eilertsen ............... H01G 9/042
(Continued)

FOREIGN PATENT DOCUMENTS

CN    103337362 A    10/2013
EP      1222498 B1    9/2000
(Continued)

OTHER PUBLICATIONS

D. Stoller, M. et al. Interfacial capacitance of single layer graphene. Energy & Environmental Science 4, 4685-4689 (2011).
(Continued)

*Primary Examiner* — Dion Ferguson
(74) *Attorney, Agent, or Firm* — 24IP Law Group USA, PLLC; Timothy R DeWitt

(57) ABSTRACT

Disclosed is a method for the manufacture of a multilayer structure comprising a first layer, a second layer and a third layer for example to form a capacitor. The multilayer structure comprises a first layer, a second layer and a third layer, wherein the first layer and the third layer each form at least one of at least two electrodes and comprise one or more pyrolyzed carbon nanomembranes or one or more layers of graphene, and the second layer is a dielectric comprising one or more carbon nanomembranes.

19 Claims, 11 Drawing Sheets

(51) Int. Cl.
  G03F 7/20    (2006.01)
  H01G 4/08    (2006.01)
  H01G 4/228   (2006.01)
  B32B 9/00    (2006.01)
  G03F 7/16    (2006.01)
  G03F 7/26    (2006.01)
  B82Y 40/00   (2011.01)
  B82Y 30/00   (2011.01)

(52) U.S. Cl.
  CPC .............. *G03F 7/2037* (2013.01); *G03F 7/26* (2013.01); *H01G 4/008* (2013.01); *H01G 4/228* (2013.01); *B32B 2457/16* (2013.01); *B82Y 30/00* (2013.01); *B82Y 40/00* (2013.01); *C01B 2204/04* (2013.01); *C01B 2204/06* (2013.01); *C01B 2204/22* (2013.01); *C01P 2006/40* (2013.01)

(56) References Cited

U.S. PATENT DOCUMENTS

| | | | |
|---|---|---|---|
| 9,458,019 | B2 | 10/2016 | Gölzhäuser et al. |
| 9,496,090 | B2* | 11/2016 | Eilertsen ................ H01G 9/042 |
| 2005/0207094 | A1 | 9/2005 | Borland et al. |
| 2009/0174435 | A1 | 7/2009 | Stan et al. |
| 2013/0050901 | A1 | 2/2013 | Lee et al. |
| 2013/0215551 | A1* | 8/2013 | Bowers ................... B32B 37/14 361/301.1 |
| 2014/0111906 | A1* | 4/2014 | Eilertsen ................ H01G 9/042 361/502 |

FOREIGN PATENT DOCUMENTS

| | | |
|---|---|---|
| EP | 1712298 B1 | 6/2006 |
| WO | 2009030473 | 3/2009 |

OTHER PUBLICATIONS

Zhan C., Neal, J., Wu, J. & Jiang, D. Quantum Effects on the Capacitance of Graphene-Based Electrodes. J. Phys. Chem. C 119, 22297-22303 (2015).
Turchanin, A. et al. Conversion of Self-Assembled Monolayers into Nanocrystalline Graphene: Structure and Electric Transport. Acs Nano 5, 3896-3904 (2011).
Haag, R., Rampi, M. A., Holmlin, R. E. & Whitesides, G. M. Electrical Breakdown of Aliphatic and Aromatic Self-Assembled Monolayers Used as Nanometer-Thick Organic Dielectrics. J. Am. Chem. Soc. 121, 7895-7906 (1999).
Heitzer, H. M., Marks, T. J. & Ratner, M. A. Maximizing the Dielectric Response of Molecular Thin Films via Quantum Chemical Design. ACS Nano 8, 12587-12600 (2014).
Li, X. et al. Transfer of Large-Area Graphene Films for High-Performance Transparent Conductive Electrodes. Nano Letters 9, 4359-4363 (2009).
Matei, D. G. et al. Functional Single-Layer Graphene Sheets from Aromatic Monolayers. Advanced Materials 25, 4146-4151 (2013).
Rampi, M. A., Schueller, O. J. A. & Whitesides, G. M. Alkanethiol self-assembled monolayers as the dielectric of capacitors with nanoscale thickness. Appl. Phys. Lett. 72, 1781-1783 (1998).
Slowinski, K., Chamberlain, R. V., Miller, C. J. & Majda, M. Through-Bond and Chain-to-Chain Coupling. Two Pathways in Electron Tunneling through Liquid Alkanethiol Monolayers on Mercury Electrodes. J. Am. Chem. Soc. 119, 11910-11919 (1997).
A. J. Kronemeijer et al., "Electrical characteristics of conjugated self-assembled monolayers in large-area molecular junctions." Applied Physics Letters 97, 173302 (2010).
A. Mishchenko et al., "Influence of Conformation on Conductance of Biphenyl-Dithiol Single-Molecule Contacts." Nano Letters 10, 156 (2010).
A. Turchanin, et al., "One Nanometer Thin Carbon Nanosheets with Tunable Conductivity and Stiffness." Advanced Materials 21, 1233 (2009).
Amin et al., "Polymer Carpets." Small 6, 1623 (2010).
C. T. Nottbohm et al., "Novel carbon nanosheets as support for ultrahigh-resolution structural analysis of nanoparticles." Ultramicroscopy 108, 885 (2008).
D. A. Egger et al., "Polarity Switching of Charge Transport and Thermoelectricity in Self-Assembled Monolayer Devices." Advanced Materials 24, 4403 (2012).
H. B. Akkerman, B. de Boer, "Electrical conduction through single molecules and self-assembled monolayers." Journal of Physics: Condensed Matter 20, 013001 (2008).
Eck et al., "Freestanding nanosheets from crosslinked biphenyl self-assembled monolayers." Advanced Materials 17, 2583 (2005).
Holmlin et al., "Electron Transport through Thin Organic Films in Metal-Insulator-Metal Junctions Based on Self-Assembled Monolayers." J. Am. Chem. Soc., 123, 5075 (2001).
H. B. Akkerman et al., "Towards molecular electronics with large-area molecular junctions." Nature 441, 69 (2006).
Felgenhauer et al., "Electrochemical and exchange studies of self-assembled monolayers of biphenyl based thiols on gold." J. Electroanal. Chem. 550-551, 309 (2003).
G. Wang et al., "A New Approach for Molecular Electronic Junctions with a Multilayer Graphene Electrode." Advanced Materials 23, 755 (2011).
G. Heimel et al., "Modeling the Electronic Properties of Pi-Conjugated Self-Assembled Monolayers." Advanced Materials 22, 2494 (2010).
T. Ishida et al., "Electrical Conduction of Conjugated Molecular SAMs Studied by Conductive Atomic Force Microscopy." J. Phys. Chem. A, 106, 3271 (2002).
J. G. Kushmerick et al., "Metal-Molecule Contacts and Charge Transport across Monomolecular Layers: Measurement and Theory." Physical Review Letters 89, 086802 (2002).
L. A. Bumm et al., "Electron Transfer through Organic Molecules." J. Phys. Chem. B 103, 8122 (1999).
L. Venkataraman et al., "Dependence of single-molecule junction conductance on molecular conformation." Nature 442, 904 (2006).
M. Leijnse, "Interaction effects in electric transport through self-assembled molecular monolayers." Physical Review B 87, 125417 (2013).
Shi et al., "Boron Nitride—Graphene Nanocapacitor and the Origins of Anomalous Size-Dependent Increase of Capacitance." Nano Letters 14, 1739 (2014).
R. C. Chiechi et al., "Eutectic Gallium—Indium (EGaIn): A Moldable Liquid Metal for Electrical Characterization of Self-Assembled Monolayers." Angew. Chem. Int. Ed. 47, 142 (2008).
S. H. Choi et al., "Electrical resistance of long conjugated molecular wires." Science 320, 1482 (2008).
A.Turchanin, A. Gözhäuser, "Carbon nanomembranes from self-assembled monolayers: Functional surfaces without bulk." Progress in Surface Sciences 87, 108 (2012).
V. B. Engelkes et al., "Length-Dependent Transport in Molecular Junctions Based on SAMs of Alkanethiols and Alkanedithiols: Effect of Metal Work Function and Applied Bias on Tunneling Efficiency and Contact Resistance." J. Am. Chem. Soc. 126, 14287 (2004).
S. Wakamatsu et al., "Dependence of Tunneling Current Through a Single Molecule of Phenylene Oligomers on the Molecular Length." Ultramicroscopy 97, 19 (2003).
W. Y. Wang et al., "Mechanism of electron conduction in self-assembled alkanethiol monolayer devices." Phys. Rev. B 68, 035416 (2003).
D. J. Wold et al., "Distance Dependence of Electron Tunneling through Self-Assembled Monolayers Measured by Conducting Probe Atomic Force Microscopy: Unsaturated versus Saturated Molecular Junctions." J Phys Chem B 106, 2813 (2002).
Woszczyna et al., "All-Carbon Vertical van der Waals Heterostructures: Non-destructive Functionalization of Graphene for Electronic Applications." Adv. Mat., 26, 4831 (2014).

(56) References Cited

OTHER PUBLICATIONS

X. Zhang et al., "Mechanical characterization of carbon nanomembranes from self-assembled monolayers." Beilstein J Nanotech. 2, 826 (2011).
Y. Selzer et al., "The Importance of Chemical Bonding to the Contact for Tunneling through Alkyl Chains." J. Phys. Chem. B 106, 10432 (2002).
Lee, J. A., Shin, M. K., Kim, S. H., Kim, S. J., Spinks, G. M., Wallace, G. G., . . . Baughman, R. H. (2012). Hybrid nanomembranes for high power and high energy density supercapacitors and their yarn application. ACS Nano, 6(1), 327-334.

* cited by examiner

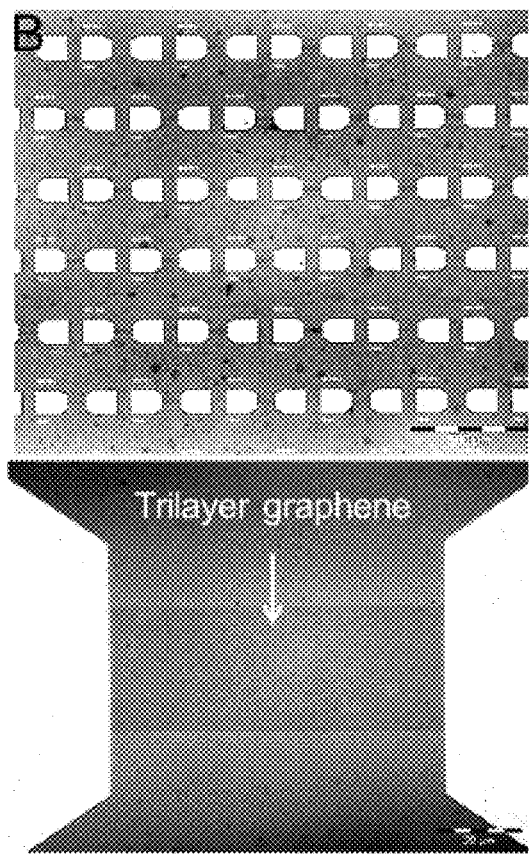 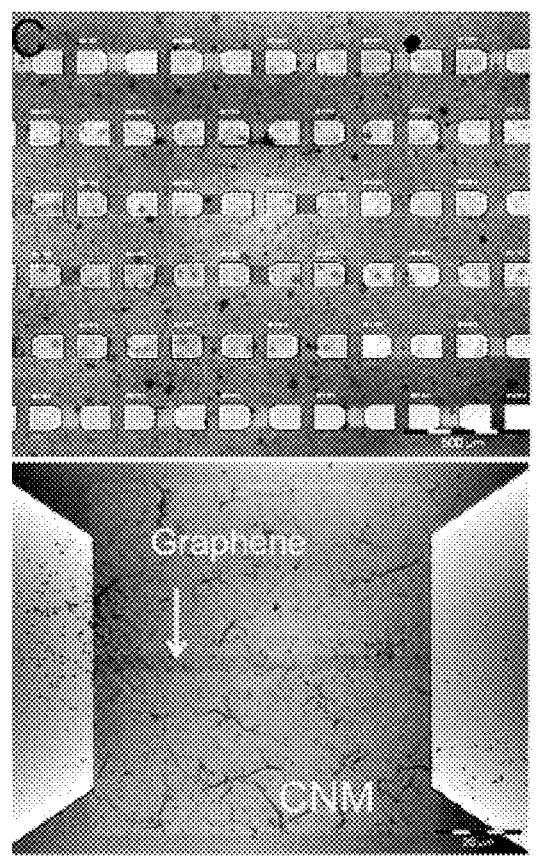
Fig. 6E                    Fig. 6F

METHOD OF MANUFACTURE OF A MULTILAYER STRUCTURE

CROSS-REFERENCE TO RELATED APPLICATIONS

This application is a continuation-in-part of U.S. patent application Ser. No. 15/322,131 filed on Dec. 26, 2016 which is a U.S. National Stage of International Patent Application No. PCT/EP2015/064562 filed on Jun. 26, 2015 and claims benefit to and priority of UK Patent Application No. 1411334.4 filed on Jun. 26, 2014 and entitled "Multilayer Structures".

BACKGROUND OF THE INVENTION

Field of the Invention

The field of the invention relates to a multilayer structure comprising a first layer, a second layer and a third layer, a capacitor comprising at least one multilayer structure, a capacitor comprising at least two two-layer structures, a method of manufacture of the multilayer structure, a method of manufacture of the capacitor, a microelectronic device and an energy storage device comprising the capacitor.

Brief Description of the Related Art

Large-area molecular electronics incorporating highly ordered self-assembled monolayers (SAMs) provide a promising route to the fabrication of reliable and stable nanodevices, as well as a versatile platform to tailor the electronic transport properties at the molecular level (H. B. Akkerman, B. de Boer, J. Phys. Condens. Mat. 2008, 20, 013001; H. B. Akkerman et al., Nature 2006, 441, 69). For small-area molecular junctions, charge transport through SAMs has been intensively studied using a variety of methods, such as scanning tunneling microscopy (STM) (L. A. Bumm et al., J. Phys. Chem. B 1999, 103, 8122), conducting-probe atomic force microscopy (CP-AFM) (V. B. Engelkes et al., J. Am. Chem. Soc. 2004, 126, 14287), nanopore device (W. Y. Wang et al., Phys. Rev. B 2003, 68, 035416), and cross-wire junction (J. G. Kushmerick et al., Phys. Rev. Lett. 2002, 89, 086802). Different methods for large-area junctions were also applied, for instance, using a conductive polymer or graphene multilayers as an interlayer (A. J. Kronemeijer et al., Appl. Phys. Lett. 2010, 97, 173302; G. Wang et al., Adv. Mater. 2011, 23, 755), Hg-droplet-based electrode (Y. Selzer et al., J. Phys. Chem. B 2002, 106, 10432), and eutectic Ga—In (EGaIn) tip-based electrode (R. C. Chiechi et al., Angew. Chem. Int. Ed. 2008, 47, 142). The mechanism of charge transport through alkanethiol SAMs is off-resonant tunneling with a tunneling decay factor $\beta$ from 0.51 to 1.16 $\text{Å}^{-1}$ (H. B. Akkerman, B. de Boer, J. Phys. Condens. Mat. 2008, 20, 013001). For $\pi$-conjugated molecules shorter than ~3 nm the transport is still dominated by a tunneling mechanism, while hopping conduction has been observed for the $\pi$-conjugated molecules longer than ~3 nm (S. H. Choi et al., Science 2008, 320, 1482). Understanding of relationships between the molecular structure and the charge transport characteristics is still a big challenge. The influence of molecular conformation on the conductance has been investigated on single molecule junctions. For instance, the biphenyl derivatives with smaller torsion angles between two phenyl rings possess higher conductance than those biphenyl derivatives with larger torsion angles (A. Mishchenko et al., Nano Lett. 2010, 10, 156; L. Venkataraman et al., Nature 2006, 442, 904). Moreover, differences between single-molecule and monolayer junctions have been investigated in terms of local molecular environment of a monolayer junction, such as interfacial charge rearrangement, dipole-dipole interactions, and intermolecular Coulomb interactions (D. A. Egger et al., Adv. Mater. 2012, 24, 4403; G. Heimel et al., Adv. Mater. 2010, 22, 2494; M. Leijnse, Phys. Rev. B 2013, 87, 125417).

Electron irradiation causes decomposition of aliphatic SAMs, but induces lateral cross-linking (coupling of the adjacent phenyl rings) in aromatic SAMs. The cross-linking of SAMs gives rise to a carbon nanomembrane (CNM) (A. Turchanin, A. Golzhauser, Prog. Surf. Sci. 2012, 87, 108) of molecular thickness that exhibits enhanced mechanical strength and thermal stability (X. Zhang et al., Beilstein J Nanotech. 2011, 2, 826). The terms "carbon nanomembrane" and "cross-linked SAMs" can therefore be used synonymously. Carbon nanomembranes have also been described in EP 1 222 498 B1. The carbon nanomembranes in this patent arise from low molecular aromatics which are cross-linked in the lateral direction.

Due to its remarkable mechanical properties, the CNMs can be released from the initial substrate and transferred onto another solid or porous support and thereby form suspended membranes with macroscopic lateral size (C. T. Nottbohm et al., Ultramicroscopy 2008, 108, 885; A. Turchanin et al., Adv. Mater. 2009, 21, 1233). Eck et al. have shown that the CNMs are stable as freestanding membranes and can be transferred. The CNMs have been released from a substrate by selective cleavage of the anchorgroup-substrate bond or by dissolution of the substrate (Eck et al., Adv. Mater. 2005, 17, 2583).

Carbon nanomembranes and multilayers of carbon nanomembranes can be transformed into graphitic material (nanocrystalline graphene or even graphene) by pyrolyzation at temperatures above 1000 K as disclosed in U.S. Pat. No. 9,458,019 B2, Matei et al. Adv. Mater. 25, 4146 (2013) and A. Turchanin et al., ACS Nano 5, 3896 (2011). The thickness of these pyrolyzed carbon nanomembranes corresponds to the thickness of the original CNM or multilayers of CNMs.

While a molecular junction of SAMs is considered to be an ensemble of many parallel molecular junctions, the cross-linked SAMs or CNMs provide a unique two-dimensional (2D) system of covalently bonded molecular junctions.

Carbon nanomembranes can be used in layer systems for use as a microelectronic device or a capacitor, in which the carbon nanomembrane is used as the insulating layer. Such a layer system comprising carbon nanomembranes has been described in EP 1 712 298 B1. The organic molecules which are cross-linked in the lateral direction are chemisorbed on the substrate. The compounds forming the cross-linked monolayer comprise an anchor group for chemisorption on the substrate. An electrically conductive, ferromagnetic or semiconductor layer is deposited on top of the monolayer. The layer system of EP 1 712 298 B1 comprises a thin isolating layer. It is not intended, however, to provide particularly thin electrodes. In EP 1 712 298 B1, the top working layer is prepared by adsorbing metal atoms or organic molecules on top of the cross-linked monolayer.

Layer systems of the state of the art usually comprise conventional electrodes which are not very light weight. They are also not very flexible and stable. A further disadvantage of conventional microelectronic devices or capacitors comprising layer systems is that they often comprise harmful or toxic components.

Another layer system is disclosed in Shi et al. (Nano Lett. 2014, 14, 1739). The disclosed nanocapacitor comprises a thin hexagonal boron nitride layer as a dielectric. The preparation of boron nitride is complex, and it is difficult to prepare thin homogenous monolayers of boron nitride on large areas. Functionalization of boron nitride is not possible.

An article by Woszczyna et al "All-carbon vertical van der Waals heterostructures: Non-destructive functionalization of graphene for electronic applications" in Advanced Materials, vol. 26 (2014), 28, 4831-4837, teaches the manufacture of a heterostructure comprising an amino-terminated carbon nanomembrane and a single layer graphene sheet grown on an oxidized silicon wafer. The heterostructures can be used for the fabrication of field-effect devices.

It is an object of the present invention to provide a carbon-based, light-weight multilayer structure comprising ultrathin, flexible and stable layers for use as a capacitor with a high energy density and without harmful or toxic components. It is also an object of the present invention to provide a capacitor comprising at least one multilayer structure, a method of manufacture of a multilayer structure and a microelectronic and an energy storage device comprising the capacitor.

SUMMARY OF THE INVENTION

A multilayer structure comprising a first layer, a second layer and a third layer is disclosed. The first layer and the third layer each form at least one of at least two electrodes and comprise one or more pyrolyzed carbon nanomembranes or one or more layers of graphene, and the second layer is a dielectric comprising one or more carbon nanomembranes. The multilayer structure is manufactured substantially from carbon and includes no potentially toxic components and have thus a low environmental impact. The multilayer structure can be used, for example, to manufacture implantable electronic devices which are compatible with living organisms, as the multilayer structure is made substantially from carbon, which is expected to be compatible to living tissue.

In one aspect of the disclosure, at least one of the first layer or the third layer has a thickness of 0.3 to 20 nm. At least one of the first layer or the third layer may thus have a minimal thickness of 0.3 nm.

In a further aspect of the disclosure, at least one of the one or more carbon nanomembranes of the second layer has a thickness of 1 to 2 nm and the total thickness of the second layer is 1 to 50 nm. At least one or more carbon nanomembranes of the second layer may thus have a minimal thickness of 1 nm.

The total thickness of the multilayer structure may be 1.6 to 90 nm.

It is further intended that the carbon nanomembranes may comprise aromatic molecules, which are cross-linked in the lateral direction.

The multilayer structure may have a resistance of at least 10 kOhm·cm$^2$.

The multilayer structure may have a maximum capacitance of 5 μF cm$^{-2}$.

In a further aspect of the disclosure, at least one of the surfaces of the carbon nanomembrane or the surfaces of the pyrolyzed carbon nanomembrane are functionalized.

A capacitor comprising at least one multilayer structure is also disclosed.

A capacitor comprising at least two two-layer structures, wherein each of the at least two two-layer structures comprises a first layer and a second layer as disclosed above and wherein the at least two two-layer structures are wound onto a former or layered on top of each other is also disclosed.

The multilayer structure comprising a first layer, a second layer and a third layer, may be manufactured by a method comprising the steps of:
  separately preparing the first layer and the third layer, wherein the first layer and the third layer each comprise at least one pyrolyzed carbon nanomembrane by the steps of:
  a) providing at least one substrate layer,
  b) adding carbon-containing compounds to a surface of the at least one substrate layer
  c) cross-linking of the carbon-containing compounds, thus forming at least one carbon nanomembrane on the surface of the at least one substrate layer,
  d) removing the at least one carbon nanomembrane from the at least one substrate layer,
  e) wherein either after method step c) or after method step d) the method further comprises pyrolyzing the carbon nanomembrane to form a pyrolyzed carbon nanomembrane, thus separately forming the first layer and the third layer,
  preparing the second layer comprising at least one carbon nanomembrane by the steps of:
  i) providing a substrate layer,
  ii) adding carbon-containing compounds to a surface of the substrate layer
  iii) cross-linking of the carbon-containing compounds, thus forming the at least one carbon nanomembrane on the surface of the substrate layer,
  iv) removing the at least one carbon nanomembrane from the substrate layer,
  forming the multilayer structure by applying the second layer onto a surface of the first layer and applying the third layer onto a surface of the second layer.

In one aspect of the disclosure, at least one of the first layer or the third layer may comprise a plurality of pyrolyzed carbon nanomembranes formed by steps a) to e) and layering the plurality of pyrolyzed carbon nanomembranes on top of each other, thus separately forming the at least one of the first layer and the third layer.

In a further aspect of the disclosure, at least one of the first layer or the third layer comprise a plurality of carbon nanomembranes formed by the above steps a) to d), layering the plurality of carbon nanomembranes on top of each other, and subsequently pyrolyzing according to step e) the plurality of carbon nanomembranes to form a pyrolyzed carbon nanomembrane, thus separately forming the at least one of the first layer and the third layer.

The second layer may comprise a plurality of carbon nanomembranes formed by the above steps i) to iv), and subsequently layering the plurality of carbon nanomembranes on top of each other.

In a further aspect of the disclosure, the second layer comprises a plurality of carbon nanomembranes formed by the above steps i) to iv), wherein after the above step iii), the steps ii) and iii) are repeated to thereby obtain the plurality of carbon nanomembranes on the surface of the substrate layer, which are layered onto one another, and in the above step iv), the more than one carbon nanomembrane is removed from the substrate.

In one aspect of the disclosure, the forming of the multilayer structure comprises layering the first layer, the second layer and the third layer onto one another.

The method of manufacture may further comprise functionalizing at least one of a plurality of surfaces of the carbon nanomembrane or the surfaces of the pyrolyzed carbon nanomembrane.

The functionalizing may be performed by chemical lithography.

The capacitor as disclosed above may be manufactured by a method, comprising the step of winding onto a former or layering on top of each other the at least two two-layer structures, wherein each of the at least two two-layer structures comprises a first layer and a second layer as disclosed above.

A microelectronic device comprising the above capacitor is also disclosed.

An energy storage device comprising the above capacitor is also disclosed.

DESCRIPTION OF THE FIGURES

For a more complete understanding of the present invention and the advantages thereof, reference is now made to the following description and the accompanying drawings, in which:

FIG. 6A illustrates preparation of bottom electrodes and metallic contact pads. FIG. 6B illustrates transfer and subsequent patterning of dielectric layer. FIG. 6C illustrates transfer of top electrode ribbons. FIG. 6D illustrates preparation of metallic contact pads and disconnection of capacitors from one another.

FIG. 6E is a light microscopic image of the bottom electrodes and metallic contacts.

FIG. 6F is a light microscopic image of the transferred and patterned dielectric layer.

DETAILED DESCRIPTION OF THE INVENTION

The invention will now be described in detail. Drawings and examples are provided for better illustration of the invention. It will be understood that the embodiments and aspects of the invention described herein are only examples and do not limit the protector's scope of the claims in any way. The invention is defined by the claims and their equivalents. It will be understood that features of one aspect or embodiment of the invention can be combined with the feature of a different aspect or aspects and/or embodiments of the invention.

Figure 1:
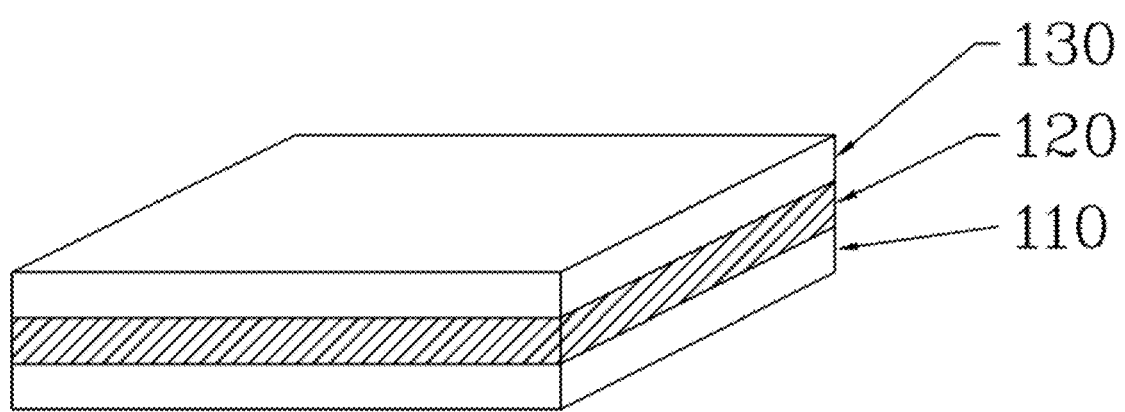
FIG. 1 is a diagram showing a multilayer structure in accordance with a preferred embodiment of the present invention.

FIG. 1 shows a multilayer structure according to the present invention comprising a first layer 110, a second layer 120 and a third layer 130, wherein the first layer and the third layer each form at least one of at least two electrodes and comprise one or more pyrolyzed carbon nanomembranes or one or more layers of graphene, and the second layer is a dielectric comprising one or more carbon nanomembranes.

The terms "carbon nanomembranes" (CNM) and "cross-linked self-assembled monolayers" (cross-linked SAM) are used synonymously in the present disclosure. The multilayer structure of the present disclosure comprises a first layer, a second layer and a third layer. The first and the third layer each form at least one of at least two electrodes and comprise one or more pyrolyzed carbon nanomembranes or one or more layers of graphene. The second layer is a dielectric comprising one or more carbon nanomembranes and thus forms the insulating layer. Each layer is ultrathin and mechanically stable. The multilayer structure therefore comprises conductive and non-conductive/insulating nanomembranes. A capacitor comprising the at least one multilayer structure is much thinner than conventional capacitors.

The at least one multilayer structure which can be used as a capacitor is almost completely based on carbon (besides hydrogen and, optionally, nitrogen, sulphur or oxygen adatoms). The carbon-based construction of the carbon nanomembranes are very light weight. The carbon nanomembrane is also very flexible and can be used for application in flexible polymer electronics. The multilayer structure is comprised of carbon nanomembranes or graphene. No other components are necessary.

The carbon nanomembranes can be easily transferred and can therefore be termed "freestanding" carbon nanomembranes. The carbon nanomembranes show high mechanical strength and thermal stability. Carbon nanomembranes can be prepared as thin homogenous monolayers on a large scale, i. e. on large areas (for example larger than several square meters).

The carbon nanomembranes have a low environmental impact. The carbon nanomembranes do not include environmentally harmful or toxic components, that can be found in other capacitors, such as carbon-based supercapacitors, which use such environmentally harmful components as electrolytes.

The process of pyrolysis refers to the heating of the compounds under inert gas or a reduced pressure. The pyrolysis of amorphous organic carbon nanomembranes leads to a structural change of the aromatic rings incorporated in the organic carbon nanomembranes, which renders the carbon nanomembranes conductive. The term "pyrolyzed carbon nanomembranes" is therefore synonymous with the term "conductive carbon nanomembranes". With further pyrolysis, nanocrystalline graphene is formed, as described in U.S. Pat. No. 9,458,019 B2. However, the graphene of the present disclosure can also be provided by any other method.

The pyrolyzed carbon nanomembranes or graphene used as an electrode instead of conventional electrodes lead to a reduction in the weight, and increased flexibility and stability. Short circuits can be avoided although the carbon nanomembranes are extremely thin, because the electrode layers are two-dimensional structures, which are transferred as a whole and thus cover pinholes and small defects in the dielectric layer like a blanket. In contrast, conventional thin electrodes are usually produced by deposition techniques such as atomic layer deposition, so that pinholes and small defects in the dielectric layer are filled with electrode material leading to a short circuit between the electrode layers. The multilayer structure is almost completely based on carbon and does not include any harmful or toxic components.

It was surprising that 1.) a multilayer structure as herein described can be formed and used as a capacitor, 2.) such a multilayer structure may have a resistance of at least 10 kOhm·cm$^2$, which was not obvious for a multilayer structure with a dielectric layer consisting of a material with a conjugated electron system, 3.) the dielectric layer as well as the electrode layers in the multilayer structure can be both produced substantially from carbon alone, 4.) the layers in the multilayer structure as herein described can be individually produced and subsequently transferred onto each other to form the multilayer structure, and 5.) short circuits over pinholes and small defects in the dielectric layer can be avoided due to the two-dimensional structure of the electrode layer material.

The resistance of the multilayer structure can be considered to be a junction resistance. The following resistance values of the dielectric layer (which would be used as second layer 120) were measured using a two terminal setup composed of an EGaIn tip as a top-probe electrode and an Au substrate as a second electrode, whereby the contact area of the EGaIn tip was estimated by analyzing the image taken of it by a camera:

TABLE 1

Resistance of the multilayer structure depending on the dielectric.

| Dielectric | Resistance |
| --- | --- |
| Biphenyl-CNM | 17.5 kOhm · cm$^2$ |
| Nitrobiphenyl-CNM | 50 kOhm · cm$^2$ |
| Terphenyl-CNM | 110 kOhm · cm$^2$ |
| p-Quaterphenylthiol-CNM | 370 kOhm · cm$^2$ |
| Double layer Biphenyl-CNM | 3.5 MOhm · cm$^2$ |
| Double layer Nitrobiphenyl-CNM | 1.5 MOhm · cm$^2$ |
| Triple layer Biphenyl-CNM | >63 MOhm · cm$^2$ |

CNM = carbon nanomembrane

It has thus become evident from these data that longer phenyl chains as well as additional layers of the carbon nanomembranes lead to higher resistances.

Electrical measurements of any kind, for example conducting-probe atomic force microscopy, scanning tunneling microscopy, using large area electrodes etc., can be used to determine the resistance.

The relative dielectric constant of a CNM depends on the material. The relative dielectric constant of a biphenyl-CNM is between 1 and 10.

The choice of the carbon nanomembranes thus influences the properties of the dielectric layer, such as the relative dielectric constant and the mechanical properties (Zhang et al., Beilstein J. Nanotechnol. 2011, 2, 826). It is therefore possible to adjust the mechanical stability, the electric conductivity and the permittivity of the multilayer structure over a wide range.

The teachings of this disclosure allow the manufacture of capacitors, which comprise ultrathin and ultralight carbon layers. Such capacitors are termed "foil capacitors" because of their layer structure. The energy density of the capacitors comprising the multilayer structure of the present disclosure is extremely high.

The aromatic molecules comprised in the carbon nanomembrane can be any aromatic molecules. Non-limiting examples of such aromatic molecules are phenyl, biphenyl, terphenyl, quaterphenyl, naphthaline, anthracene, bipyridine, terpyridine, thiophene, bithienyl, terthienyl, pyrrole and combinations thereof. The aromatic molecules are then cross-linked in the lateral direction.

The multilayer structure has a maximum capacitance of 5 µF cm$^{-2}$. The thicker the dielectric, the smaller the capacitance. The capacitance can be even smaller when more than one multilayer structure is layered on top of one another. The value of the maximum capacitance is based on a multilayer structure wherein the dielectric has a thickness of 1 nm and the dielectric constant is $\varepsilon_r$=5.5 (Felgenhauer et al., J. Electroanal. Chem. 550-551, 309 (2003)).

A layered capacitor with a size of 1 cm*1 cm*0.01 cm (volume=10$^{-8}$ m$^3$), a relative dielectric constant of 3 and a distance of 4 Angstrom between the layers has a capacity of 18.7 mF at a weight of 5.66 mg. The specific capacity is 1.87·10$^6$ F/m$^3$ or 1.87·10$^6$ nF/mm$^3$.

At least one of the surfaces of the carbon nanomembrane or the surfaces of the pyrolyzed carbon nanomembrane can be functionalized. The functionalizing may be performed by chemical lithography. The functionalizing allows binding of other molecules, such as aliphatic polymer chains (Amin et al., Small 2010, 6, 1623), to the at least one surface of the carbon nanomembrane. The binding of other molecules influences the relative dielectric constant of the carbon nanomembrane. The relative dielectric constant can thereby be adjusted according to one's needs.

The at least two two-layer structures may be wound onto a former or layered on top of each other. The winding or layering allows a very compact construction of the capacitor. The capacitor comprises in one aspect of the disclosure a multilayer structure comprising a first layer, a second layer and a third layer, wherein the first layer and the third layer each form at least one of at least two electrodes and comprise one or more pyrolyzed carbon nanomembranes or one or more layers of graphene, and the second layer is a dielectric comprising one or more carbon nanomembranes. It is, however, possible in another aspect of the disclosure that one layer can be used as a first layer and as a third layer at the same time. Such capacitors are formed by winding onto a former or layering on top of each other a first layer and a second layer (i.e. at least two two-layer structures). It will be understood that it is necessary to wind or layer at least two two-layer structures instead of at least two multi-layer structures in order to avoid that two electrodes are placed on top of one another.

Figure 2:
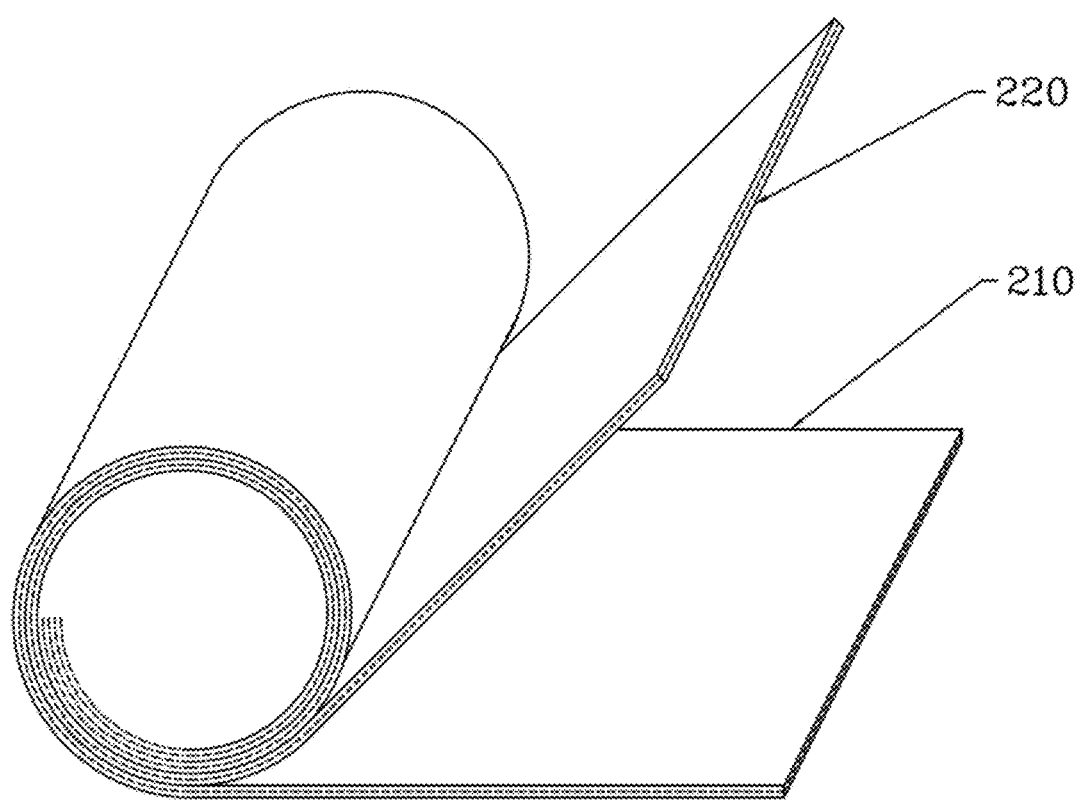
FIG. 2 is a diagram illustrating a capacitor with two two-layer structures, wherein the two two-layer structures are wound onto each other in accordance with a preferred embodiment of the present invention.

FIG. 2 shows a capacitor comprising two two-layer structures (a first two-layer structure 210 and a second two-layer structure 220), wherein each of the two two-layer structures comprises a first layer forming an electrode and a second layer forming a dielectric and wherein the two two-layer structures are wound onto a former.

Several alternative methods of manufacture of the multi-layer structure of the present disclosure are possible. All of the disclosed methods of manufacture have in common that the multilayer structure is formed by applying the second layer onto a surface of the first layer and applying the third layer onto a surface of the second layer. The methods of manufacture only differ in the preparation methods of the first layer, the second layer and the third layer.

One or more layers of graphene can be provided as the first and/or the third layer. The first layer and/or the third layer may therefore comprise one or more pyrolyzed carbon nanomembranes or one or more layers of graphene. The person skilled in the art will understand that in case of one or more layers of graphene as the first and/or the third layer, the same method of manufacture can be performed as in case of one or more pyrolyzed carbon nanomembranes. Graphene can be manufactured by pyrolyzing carbon nanomembranes, but—as discussed above—graphene can also be manufactured by other known methods. The second layer may be prepared as described above. The multilayer structure is thus formed by applying the second layer onto a surface of the first layer and applying the third layer onto a surface of the second layer. It is thus possible that the first or the third layer comprise one or more layers of graphene while the respective other layer (i.e. the third or the first layer) comprise one or more pyrolyzed carbon nanomembranes manufactured as described above.

The pyrolysis of the at least one carbon nanomembrane for forming the first and the third layer can be performed either before or after the at least one carbon nanomembrane is removed from the substrate. The cross-linking of the carbon-containing compounds ensures that the carbon nanomembranes are not burned during pyrolysis. The cross-linking of the carbon-containing compounds also ensures mechanical stability of the carbon nanomembrane.

A sacrificial layer may also be added on top of the carbon nanomembrane. The sacrificial layer and the carbon nanomembrane are then removed from the substrate together. The sacrificial layer protects the carbon nanomembrane from defects, which might occur during transfer of the carbon nanomembrane. The sacrificial layer also stabilizes the carbon nanomembrane.

The substrate only serves as an auxiliary means. The substrate can be discarded or re-used after the carbon nanomembrane is removed from the substrate.

The method of manufacture discussed above ensures that short circuits of the multilayer structure can be avoided despite the use of ultrathin layers, because the electrode layers are formed by two-dimensional materials, which are transferred as a whole and thus cover pinholes and small defects in the dielectric layer like a blanket.

The capacitors as described in the present disclosure can be used as a microelectronic device or as an energy storage device. The capacitors may be used for applications in the field of mobile communications, for example.

The carbon nanomembranes can be used as a dielectric because carbon nanomembranes can be used as insulators due to low current densities. To this end, the difference in electronic transport characteristics between pristine SAMs and carbon nanomembranes has been compared. The charge transport through aromatic SAMs or CNMs using a two terminal setup composed of an EGaIn tip as a top-probe electrode and an Au substrate as a second electrode has been studied. Three thiolphenyl homologues, i.e. biphenylthiol (BPT), terphenylthiol (TPT) and quaterphenylthiol (QPT), have been selected for the preparation of SAMs, and the electrical characteristics of pristine SAMs and CNMs have been compared.

SAM Preparation

For the preparation of 1,1'-biphenyl-4-thiol (BPT) SAMs, a 30 nm polycrystalline Au layer thermally evaporated on 9 nm Ti primed Si(100) substrate (Georg Albert Physical Vapor Deposition, Germany) was used. The substrate was cleaned with a UV/ozone cleaner (UVOH 150 LAB FHR) for 5 min, rinsed with ethanol, and then blown dry under a nitrogen stream. Afterwards the substrates were immersed into a ~10 mM solution of BPT in dry and degassed dimethylformamide (DMF) for 72 h in a sealed flask under nitrogen atmosphere at room temperature. For the preparation of 1'',4',1',1-Terphenyl-4-thiol (TPT) SAMs and p-Quaterphenyl-4-thiol (QPT) SAMs, the same procedure was applied with the exception of SAM formation for 24 h in a sealed flask under nitrogen atmosphere at 70° C.

Electron Irradiation

Electron irradiation was achieved in high vacuum (p<5× $10^{-8}$ mbar) with an electron flood gun at an electron energy of 100 eV and a beam current of 3 mA. The electron dose density of 50 mC/cm$^2$ was applied for the cross-linking of the SAMs.

Charge Transport Measurements of Molecular Junctions

The two-terminal setup consisted of a grounded Au substrate mounted on an X-Y positioning stage and a syringe with a flat needle connected to a Z axis micrometer positioning stage. The whole measurement was conducted in a home-built aluminum Faraday cage to prevent electrical noise. The whole Faraday cage was flushed with nitrogen to maintain a low level of humidity (RH=~12%). The tip was prepared by generating a small hanging droplet of Ga—In eutectic (75.5 wt. % Ga and 24.5 wt. % In) and bringing it into contact with a sacrificial gold substrate, and then retracting the syringe slowly back until the tip of the syringe separates from the tip on the substrate. The whole process was observed by a microscope camera (magnification=200). After the formation, the tip was oxidized for 15 minutes in air. Molecular junctions were formed by bringing the $Ga_2O_3$-EGaIn tip into contact with SAMs or CNMs formed on Au substrate. For statistical analysis, I-V curves were measured on each sample with 5 different tips, where each tip was used to form up to 5 junctions. The contact area was estimated by analyzing the image taken by the camera. The current through the junction was recorded as a function of V using a Keithley 236 measurement unit.

Two terminal I-V measurements were performed on the prepared molecular junctions. All the measurements were carried out in an inert and dry atmosphere to avoid the influence of an adsorbed water film at the SAM-$Ga_2O_3$ interface. A statistical model for data analysis was used (R. E. Holmlin et al., J Am Chem Soc 2001, 123, 5075; D. J. Wold et al., J Phys Chem B 2002, 106, 2813; T. Ishida et al., J Phys Chem B 2002, 106, 5886; S. Wakamatsu et al., Ultramicroscopy 2003, 97, 19.), i.e. fitting Gaussian functions to histograms of log|J|, where J is the current density.

Figure 3:
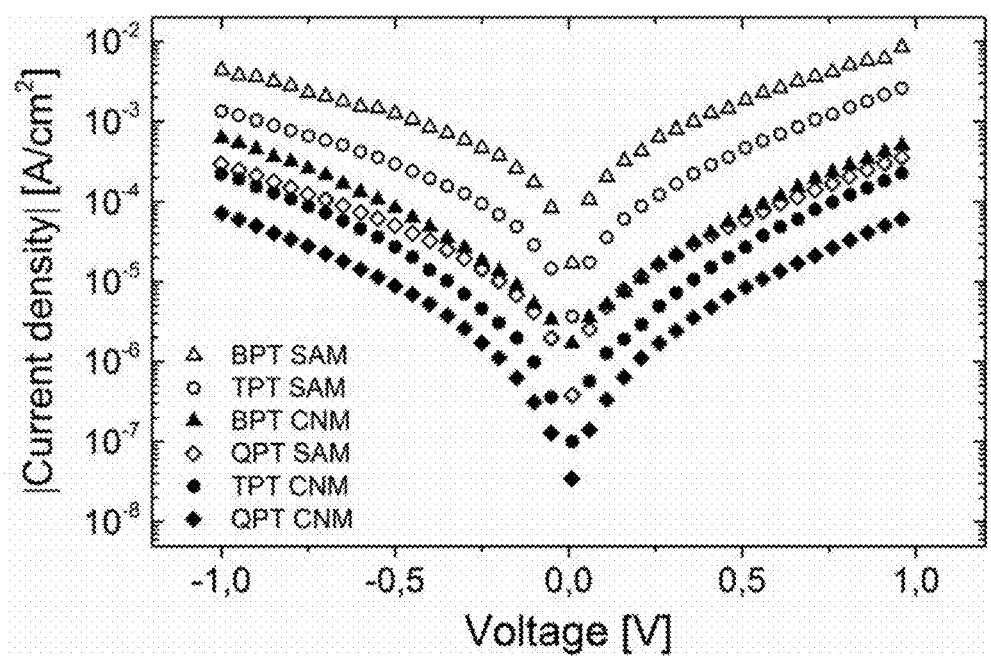
FIG. 3 is a graph comparison of log|J| versus voltage for molecular junctions of SAMs and cross-linked SAMs (CNMs).
Figure 4A:
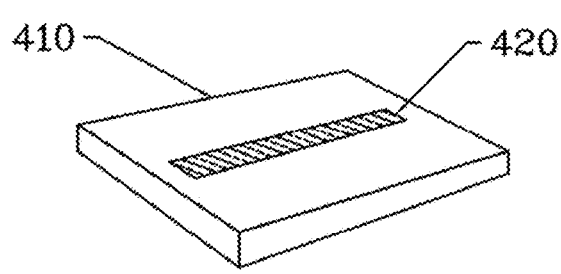
FIGS. 4A-4D are schematics illustrating the manufacturing of a capacitor in accordance with a preferred embodiment of the present invention.
Figure 4B:
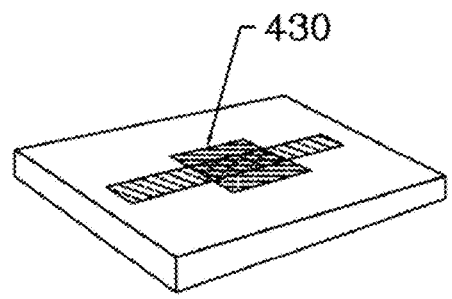
Figure 4C:
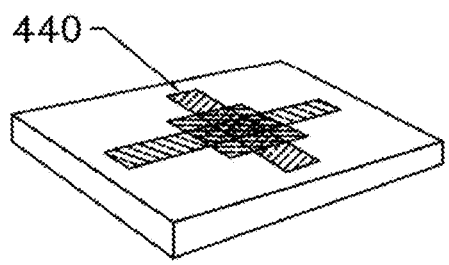
Figure 4D:
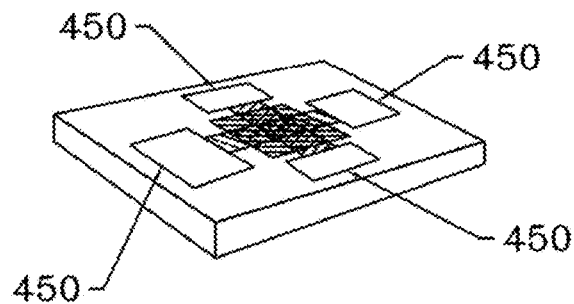

FIG. 3 shows the plots of Gaussian means of the measured current density |J| (logarithmic scale) versus voltage for molecular junctions of SAMs and CNMs made from different aromatic molecules (biphenylthiol BPT, terphenylthiol TPT, quaterphenylthiol QPT). In general, the current densities of CNM-junctions were approximately an order of magnitude lower than SAM-junctions and decreased with increasing molecular length for both systems.

Example of a Capacitor

FIG. 4 shows a schematic of the manufacturing of a capacitor. FIG. 4A shows a first layer (electrode) 420 on a substrate 410. In FIG. 4B, a second layer (dielectric) 430 is placed on the first layer (electrode) 420. A third layer (electrode) 440 on top of the second layer (dielectric) 430 is shown in FIG. 4C. Contact pads 450 for the electrodes are shown in FIG. 4D.

Figure 5:
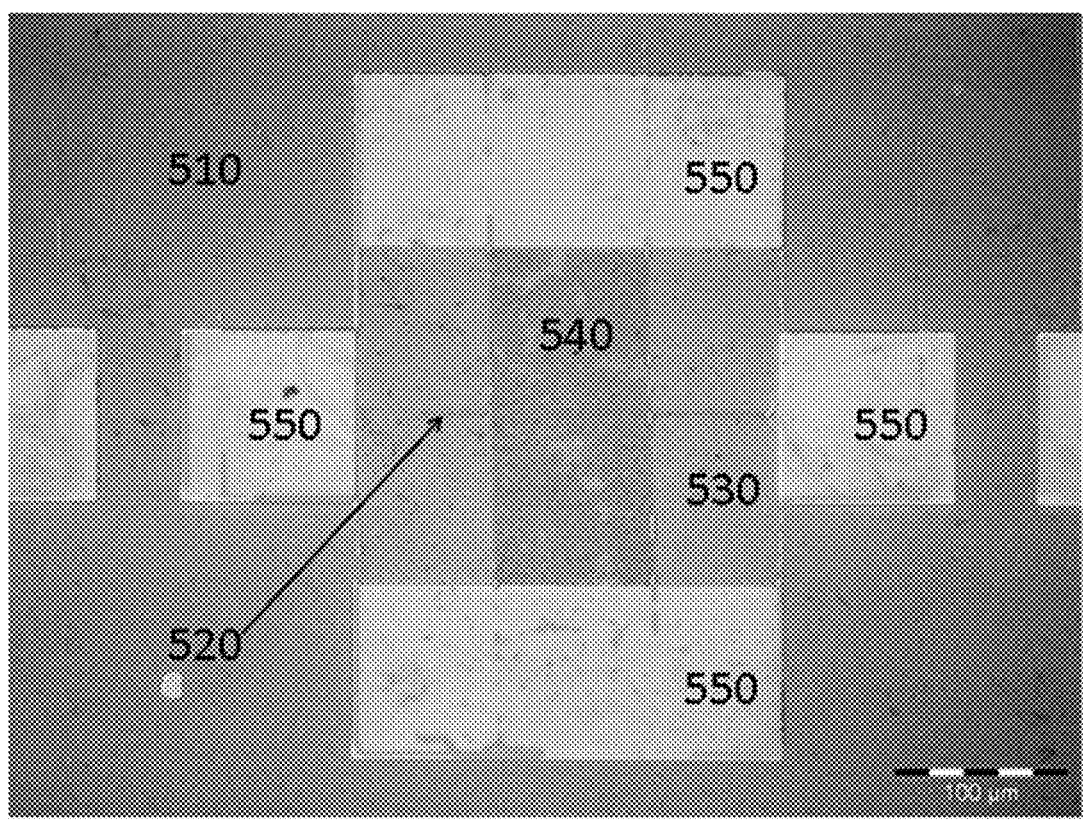
FIG. 5 is a light microscopic image of a capacitor in accordance with a preferred embodiment of the present invention.

FIG. 5 shows a light microscopic image of a capacitor manufactured according to FIG. 4 on a Si dioxide substrate 510 with a monolayer graphene 520 as a first layer (electrode), a monolayer CNM 530 as a second layer (dielectric), a monolayer graphene 540 as a third layer (electrode) and Au contact pads 550 for the electrodes. CVD graphene and biphenyl-CNMs were used. Structuring of the layers was performed by a combination of photolithography and oxygen plasma. A double layer of vapor-deposited tantalum and gold serves as an ideal electrical contact to the graphene electrodes. In the light microscopic image, the different layers can be clearly distinguished from one another due to their different shadings.

Further Example

A further example of the fabrication and characterization of an all-carbon capacitor is described with respect to FIGS. 6 to 9. In this further example, the all-carbon capacitor comprises a first carbon layer, a second carbon layer, and a third carbon layer. The second carbon layer is composed of a CNM dielectric layer and is sandwiched between the first carbon layer and the third carbon layer. The first carbon layer and the third carbon layer form two conducting sheets that act as electrodes, i.e. bottom electrodes and top electrodes, respectively. The construction of the all-carbon capacitor requires in general a combination of the bottom-up molecular self-assembly, the mechanical stacking and the top-down lithographic approaches.

A multilayer CNM, i.e. a multilayer stack of CNMs, for example, but not limited to, a six-layer CNM, was used as the dielectric layer. A multilayer stack of graphene or multilayer graphene sheet, for example, but not limited to a trilayer graphene sheet, made by chemical vapor deposition and mechanical stacking was used as bottom and top electrodes. In addition, pyrolyzed carbon nanomembranes (pCNM), were also employed as bottom and top electrodes for the capacitors. In this further example, the CNMs, the graphene and the pyrolized CNMs are pure carbon and so the first carbon layer, the second carbon layer, and the third carbon layer of the all-carbon capacitors of this second example contain no other chemical elements.

The manufacture of the all-carbon capacitor will now be described and is illustrated in FIG. 6. FIG. 6A shows a schematic illustration of the manufacture. FIGS. 6B to 6E show light microscopic images of the different stages of the manufacture. In the upper row an array of devices is shown. In the lower row a selected device is shown. It is possible to identify graphene, CNMs, and pCNMs by optical microscopy because the monochromatic contrast increases linearly with thickness for multilayer graphene and CNMs on $SiO_2$/Si substrates.

In a first step, monolayers of graphene were grown by low-pressure CVD of methane on copper foils to form the multilayer graphene sheet, which form the first carbon layer.

A direct layer-by-layer transfer method of the multilayer graphene sheet that is free from any organic residue between the monolayers of graphene was used. After the multilayer graphene sheet, e.g. a three-layer graphene stack, has been transferred onto a $SiO_2$/Si substrate 610, patterning was conducted by using electron-beam lithography and reactive ion etching in an oxygen/argon atmosphere to form bottom electrodes 620, which is followed by the deposition of metal bottom contact pads 651, as demonstrated in FIG. 6B.

Besides such graphene electrodes, pyrolyzed carbon nanomembranes with a thickness of 9±1 nm can also be employed to form the first carbon layer, which was used for the bottom electrode 620. The thickness of the pCNMs is not limiting and the thickness could be typically between 1 nm and 20 nm.

In the next step, the multilayer CNM, i.e. the second carbon layer, is transferred onto the bottom electrodes 620.

Figure 6A:
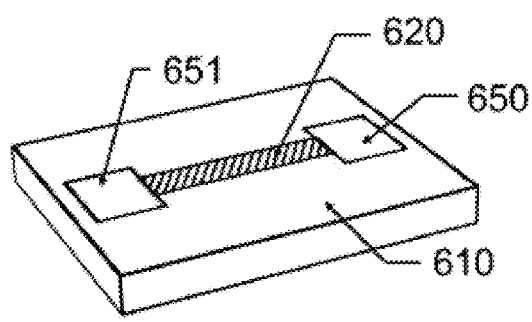
FIGS. 6A-6D are schematic illustrations of the manufacture of an all-carbon capacitor.
Figure 6B:
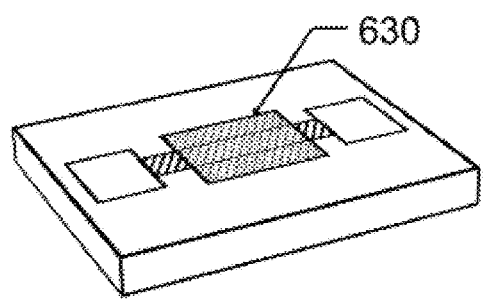
Figure 6C:
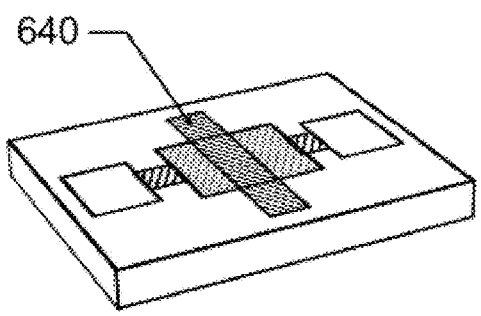

During the manufacture, water can be found to be trapped between the CNM and the target substrate in the sample, which causes defects in the dielectric if the water is not removed. Since the CNMs exhibit extremely high thermal stability and structural transformation does not occur below 450° C., the trapped water can be removed by annealing the sample for two hours in a vacuum oven at a temperature below 450° C., for example 320° C. for a two-layer CNM stack and 360° C. for a six-layer CNM stack. After the water has been removed, the multilayer CNM stack can be patterned into small squares with a dimension of e.g. 82×82 $\mu m^2$ for the dielectric layer 630, as shown in FIG. 6C.

Figure 6D:
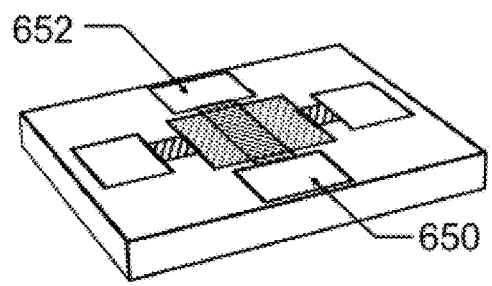
Figure 6G:
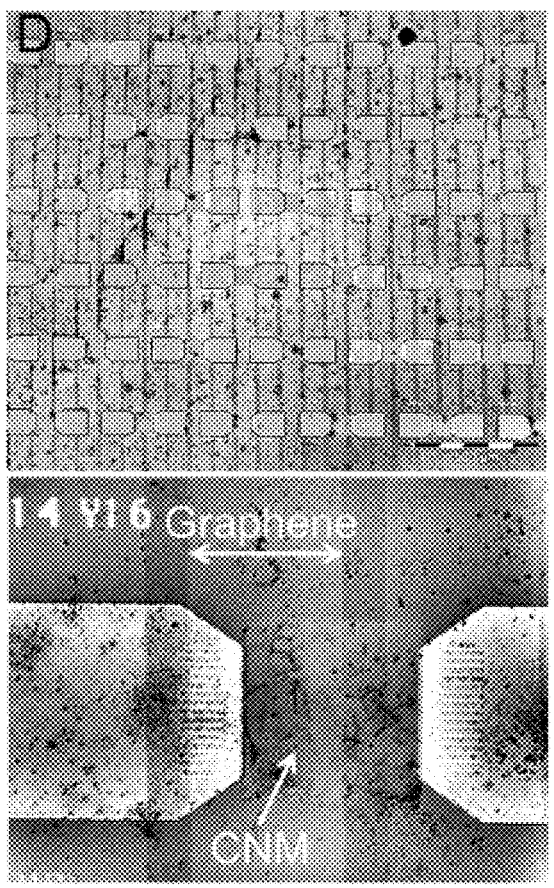
FIG. 6G is a light microscopic image of the transferred top electrode ribbons.
Figure 6H:
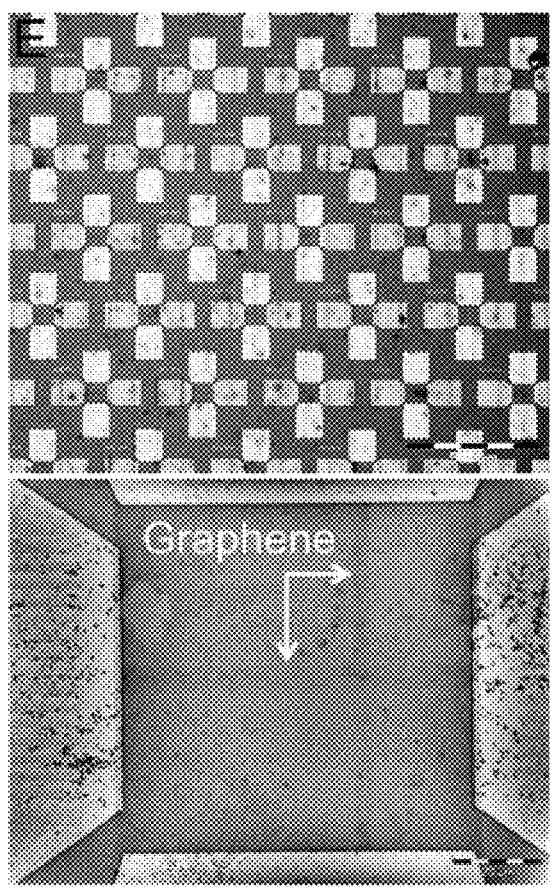
FIG. 6H is a light microscopic image of the metallic contacts on the top electrodes and separated capacitors.

The third carbon layer is used for the top electrodes 640. To fabricate the top electrodes 640 for the capacitors, a further multilayer graphene sheet, e.g. a trilayer graphene sheet, or a pCNM sheet was firstly transferred on a $Si_3N_4$/Si substrate and patterned into parallel ribbons with widths varying from 1 to 50 µm. The conductive ribbons were then released from the $Si_3N_4$/Si substrate and transferred onto the substrate 610 with bottom electrodes 620 and dielectric layers 630, as shown in FIG. 6D. Afterwards, Ti/Au top contact pads 652 were deposited, and a final electron beam patterning step was performed to remove all unwanted top electrode materials that electrically connect individual capacitors, as shown in FIG. 6E.

Each chip contains more than 500 electrically isolated capacitors. The dielectric thickness is defined by the number of CNM layers and the capacitor area by the area of bottom and top electrodes that enclose the CNM dielectric.

Materials and Fabrication of the Further Example

Fabrication of Multilayer Graphene

Monolayer graphene was prepared by chemical vapour deposition (CVD) on a Cu substrate by known methods.

The graphene layers were transferred onto a target substrate using a protecting polymer layer of PMMA (see, for example, the teachings of U.S. Pat. No. 8,377,243 B2). This PMMA layer was used for mechanical stabilization of the graphene during the transfer process. After formation of the PMMA layer on top of the graphene to form a PMMA/graphene stack, the PMMA/graphene-stack was separated from the Cu graphene growth substrate. After that, the PMMA/graphene-stack was transferred onto a second graphene/Cu sample to form a PMMA/double-graphene/Cu-stack. The PMMA/double-graphene-stack was separated from the Cu growth substrate of the second graphene layer. This procedure can be repeated to form multi-layers of graphene. Notice that only the top graphene layer was in contact with PMMA and the other interfaces do not have any contact to PMMA. Finally, the PMMA/multi-layer graphene stack, e.g. a three-layer graphene stack, was transferred onto the target substrate e.g. a $SiO_2$/Si wafer for the bottom electrodes and the PMMA layer was dissolved in acetone. For the top electrodes the multilayer graphene was transferred onto the $Si_3N_4$/Si substrates for further patterning.

Fabrication of Multilayer CNMs

Monolayer TPT-CNMs were prepared by electron irradiation of SAMs prepared from terphenylthiol (TPT) precursor molecules as described above.

The CNMs were transferred onto a target substrate using a protecting polymer layer of PMMA (as noted above, this transfer is described in U.S. Pat. No. 8,377,243 B2). This PMMA layer was used for mechanical stabilization of the CNM during the transfer process. After formation of the PMMA layer on top of the CNM, the PMMA/CNM-stack was separated from the CNM growth substrate, e.g. an Au-layer on mica. After that, the PMMA/CNM-stack is transferred onto a second CNM/Au/mica sample to form a PMMA/double-CNM/Au/mica-stack. The PMMA/double-CNM-stack was separated from the Au/mica growth substrate of the second CNM. This procedure can be repeated to form multi-layers of CNMs. Notice that only the top CNM-layer was in contact with PMMA and the other interfaces do not have any contact to PMMA. Finally, the PMMA/multi-layer CNM stack, e.g. a six-layer CNM stack, was transferred onto the target substrate e. g, a $SiO_2$/Si wafer with the tri-layer graphene bottom electrodes and the PMMA layer was dissolved in acetone.

Fabrication of Pyrolized Carbon Nanomembranes

Pyrolized carbon nanomembranes (pCNM) were prepared by pyrolyzing monolayers or multilayers of carbon nanomembranes on $SiO_2$/Si substrates at a temperature of 1100° C. in a flow of $Ar/H_2$ (9:1) with a slight atmospheric overpressure (20 mbar) by resistive heating employing a tube furnace, as known from the teachings of U.S. Pat. No. 9,458,019 B2. The thickness of the original CNM layer determines the thickness of the resulting pyrolized CNM layer, e.g. 9±1 nm for the pCNM-layer in this example.

For the bottom electrodes, no transfer of the pCNM layer was necessary, because the employed substrate was a $SiO_2$/Si substrate. For the top electrodes the pCNM layer was transferred onto the $Si_3N_4$/Si substrates for further patterning (as noted above, this transfer is described in U.S. Pat. No. 8,377,243 B2).

Patterning of Bottom Electrodes

Two types of bottom electrodes, i.e. made from multilayer graphene or from pCNM, were patterned on Sift/Si substrates. The fabrication process includes the following steps: Step 1: Spin-coating of a resist layer (PMMA) on the surface; pattern transfer into the layer by electron beam lithography (EBL) (Vistec EBPG 5000+) and resist development; reactive ion etching in an oxygen/argon plasma (Leybold Z401) of the non-protected areas of the graphene or pCNM; dissolution of PMMA in acetone. Step 2: Spin-coating of a new PMMA layer; electron beam lithography and development of the resist layer; subsequent vacuum evaporation ($10^{-6}$ mbar) of a 10 nm adhesive Ti layer and a 40 nm Au layer; lift-off of the resist. Step 3: The quality of the metal/graphene or metal/pCNM contacts could be improved significantly if an additional 100 nm thick Au layer, having a direct contact to the device bars, was evaporated. This additional gold layer was fabricated by a similar procedure as described in Step 2. The resulting structure is shown in FIG. 6B.

Patterning of Multilayer CNM Dielectric

The patterning of the multilayer CNM stack was achieved using electron beam lithography as described in step 1. above. An example resulting in dielectric areas with 82×82 $\mu m^2$ size is shown in FIG. 6C.

Patterning and Transfer of Top Electrodes

To fabricate the top electrodes, the multilayer graphene or the pCNM sheet was transferred on a $Si_3N_4$/Si substrate and patterned into parallel ribbons with widths varying from 1 to 50 μm using electron beam lithography as described in step 1. above.

For transfer from the $Si_3N_4$/Si substrate, the top graphene or pCNM electrodes were protected with a layer of PMMA. The separation of graphene/PMMA or pCNM/PMMA from the underlying $Si_3N_4$/Si substrate was conducted by bringing the sample close to the surface of aqueous hydrofluoric acid (HF, ~48%) for 20 s to weaken the adhesion between the graphene or pCNM, respectively, and the $Si_3N_4$, so that the underlying $Si_3N_4$/Si substrate was separated from the graphene/PMMA or the pCNM/PMMA stack by a slight dipping into water of one of the edges/corners of the sample. The transfer of the graphene/PMMA or pCNM/PMMA structure onto the target substrate (CNM/graphene/$SiO_2$/Si or CNM//pCNM/$SiO_2$/Si) was conducted at the air/water interface under carefully aligning the graphene or pCNM ribbon patterns to the target. The PMMA layer was dissolved in acetone.

Manufacture of Metal Contacts on Top Electrodes

Afterwards, Ti/Au top contact pads were deposited in a method which is analogous to steps 2 and 3 described for preparation of the contact pads on the bottom electrodes. The resulting structure is shown in FIG. 6D.

In a final step, the junction was protected by spin-coating a layer of PMMA. E-beam lithography and reactive ion etching was performed to preserve all the junction areas (82×82 $\mu m^2$) and to remove all un-protected areas. The optical images of these junctions are shown in FIG. 6E.

Impedance Measurements

Figure 7A:
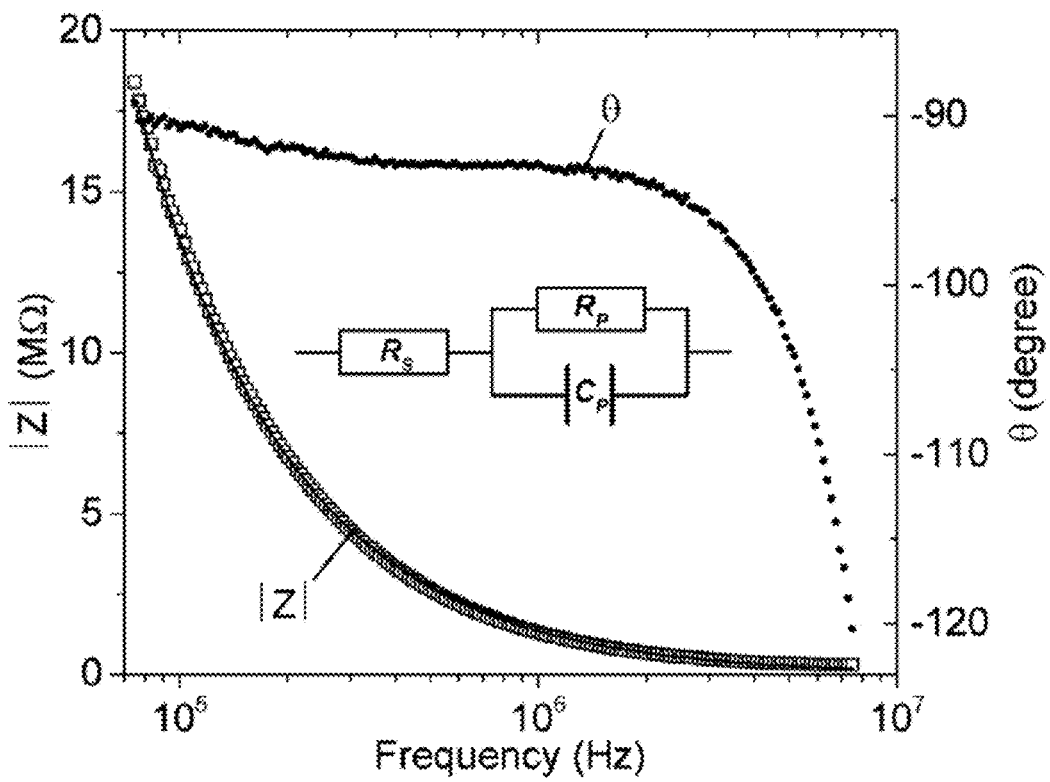
FIG. 7A is a graph of impedance spectra of a graphene/CNM/graphene capacitor with an area of 33.9 $\mu m^2$. Squares denote the impedance magnitude |Z| and the circles the phase angle θ. The curve is the spectrum fitted with the inserted equivalent circuit.
Figure 7B:
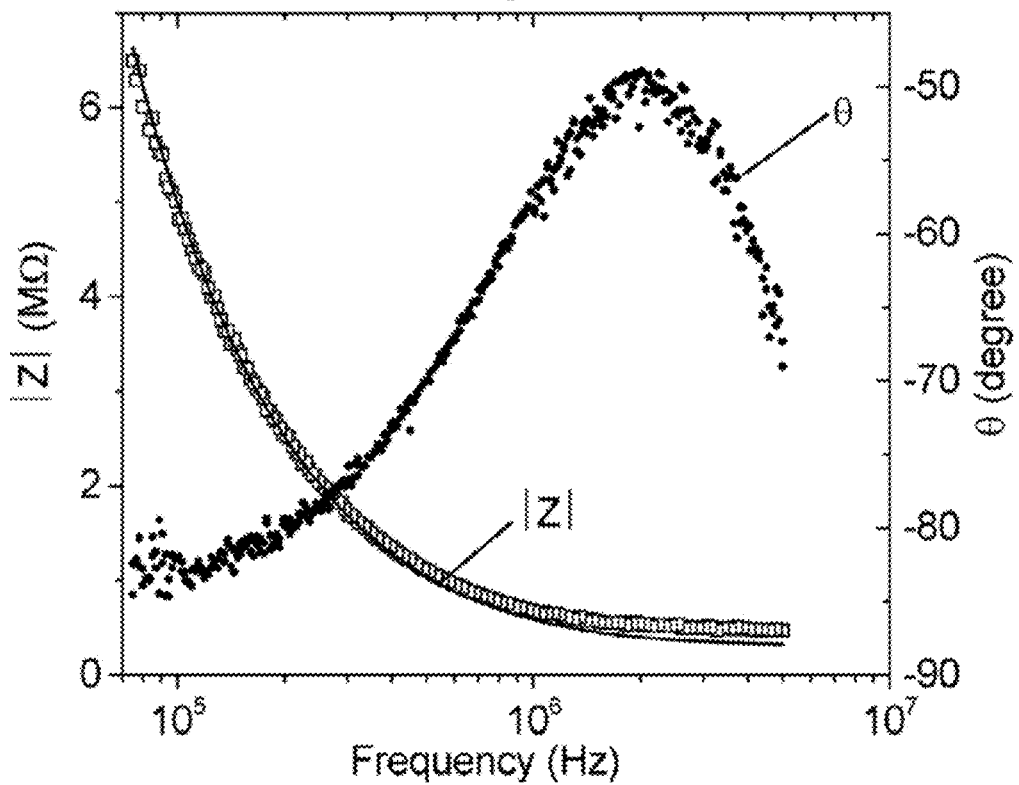
FIG. 7B is a graph of impedance spectra of a pCNM/CNM/pCNM capacitor with an area of 100 $\mu m^2$. Squares denote the impedance magnitude |Z| and the circles the phase angle θ. The curve is the spectrum fitted with the equivalent circuit inserted in FIG. 7A.

To determine the dielectric characteristics of ACCs, impedance measurements were performed on intact capacitors. FIGS. 7A and 7B display the impedance spectra (Bode representation) of a graphene/6-TPT/graphene and a pCNM/6-TPT/pCNM capacitor, respectively. The impedance spectra were fitted using a simple three-element equivalent circuit (the inset of FIG. 7A). The total impedance can be expressed as $$Z(\omega)=R_S+(R_P^{-1}+(i\omega C_P)^{-1})^{-1} \tag{1}$$

where the series resistor $R_s$ arises from the bottom and top graphene ribbons between the capacitor part and the metallic pads, the capacitance $C_P$ in parallel with the resistor $R_p$ models the capacitor.

From the fitted spectrum a capacitance of 85 fF for the graphene/6-TPT/graphene capacitor (FIG. 7A) is obtained. As a comparison, a capacitance of 0.29 pF for the pCNM/6-TPT/pCNM capacitor (FIG. 7B) is obtained. Notice that phase angles θ of the graphene/6-TPT/graphene capacitor are nearly constant until 2.5 MHz and then drop. In contrast, phase angles θ of the pCNM/6-TPT/pCNM capacitor firstly increase until 2 MHz and then drop gradually. The sheet resistance of the trilayer graphene electrodes is determined to be 691 Ω/sq, which is in good agreement with the value of 2100 Ω/sq for a monolayer graphene and of 350 Ω/sq for 4-layer graphene reported elsewhere [X. S. Li et al., Nano Lett. 9, 4359 (2009)]. The sheet resistance of the pCNM electrodes is 10.6 kΩ/sq and the corresponding electrical resistivity is 9 mΩ·cm, which is comparable to a pyrolyzed photoresist film and glassy carbon. The different sheet conductivity of two types of electrodes could partly explain different phase angles of ACCs at higher frequencies.

Dielectric Constants

Figure 8A:
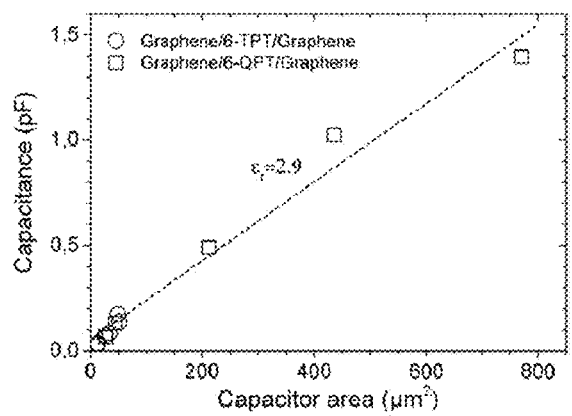
FIG. 8A illustrates The obtained capacitance of 12 capacitors versus the capacitor area A, where graphene electrodes are used. Circles denote capacitances of capacitors with a six-layer TPT-CNM dielectric layer, Squares denote capacitances of capacitors with a six-layer QPT-CNM dielectric layer.
Figure 8B:
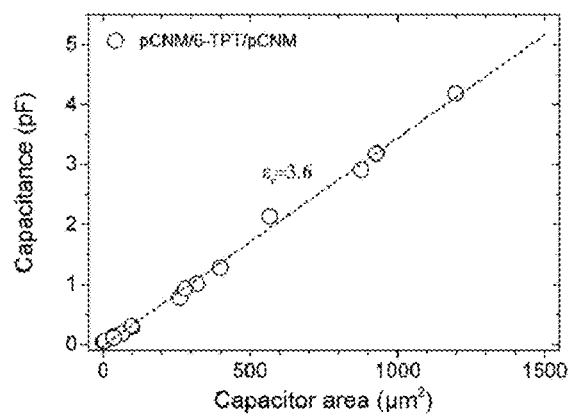
FIG. 8B illustrates the obtained capacitance of 15 capacitors as a function of the capacitor area A, where pCNM electrodes are used.

FIGS. 8A and 8B show plots of the capacitance as a function of the capacitor area. With the graphene electrodes, the maximum area of the working capacitors containing a 6-layer-TPT CNMs as dielectric layer is only 52 μm². With the pCNM electrodes, operating capacitors containing a 6-layer-TPT CNM as dielectric layer with active areas up to 1200 μm² can be fabricated. This difference can be explained by the fact that CVD graphene suffers from metal impurities that lead to short circuits and prevent the proper functioning of the capacitor. On the other hand, the pCNM electrodes do not show these impurities. Using the thicker 6-layer QPT CNM as dielectric layer, operating capacitors with larger active areas compared to those with 6-layer TPT CNM as dielectric layer were produced. The maximum active area achieved is only determined by the initial design. It is not a fundamental limit of the materials and capacitors with larger active areas up to cm² are thought to be technically feasible.

The dielectric constant $\varepsilon_r$ can be calculated using a simple equation: $C_{meas}=\varepsilon_0\varepsilon_r\cdot A/d$, where $C_{meas}$ is the measured capacitance, A is the capacitor area and d is the separation. Two different values, i.e., 2.9±0.1 for the graphene/CNM/graphene capacitors and 3.6±0.1 for the pCNM/CNM/pCNM capacitors, are derived from the two plots in FIGS. 8A and 8B. This apparent difference can be due to a reduction of the capacitance because of intrinsic or extrinsic interfacial capacitances. It has been found that quantum capacitance of the graphene electrodes could contribute to the interfacial capacitance. [M. Stoller et al., Energy Environ. Sci. 4, 4685 (2011)] Assuming that the interfacial capacitance of graphene/CNM gives rise to additional voltage drops at two interfaces, the apparent capacitance is given by $$\frac{A}{C_{meas}} = \frac{A}{C_{inter}} + \frac{A}{C_{CNM}} = \frac{1}{c_{inter}} + \frac{1}{\varepsilon_0\varepsilon_r}d \qquad (2)$$

where $c_{inter}=C_{inter}/A$ is the interfacial capacitance. $C_{inter}$ is the capacitance associated with the interfaces and $C_{CNM}$ the capacitance only associated with the CNM dielectric.

Figure 8C:
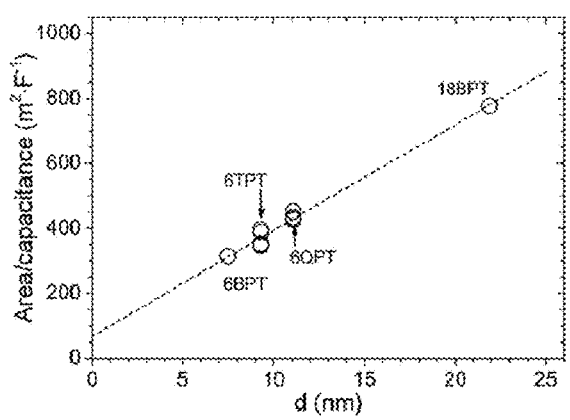
FIG. 8C illustrates the plot of Area/Capacitance as a function of the separation d: the y-axis intercept gives rise to the interfacial capacitance and its slope the dielectric constant.

FIG. 8C shows that the reciprocal areal capacitance $A/C_{meas}$ has a linear dependence on the electrode separation d with a nonzero y intercept, from which an interfacial capacitance of 1.48 μF/cm² is obtained. This value is in agreement with the value of 1.3 μF/cm² calculated from the electronic density functional theory for graphene. [C. Zhan et al., J. Phys. Chem. C119, 22297 (2015)] Moreover, an intrinsic dielectric constant of 3.5 for the CNM dielectric layer is obtained. This value is in good agreement with the obtained value for capacitors using the pCNM electrodes. As a comparison: (1) dielectric constant of aliphatic SAMs ranges from 2.0 to 3.4 [e.g. M. A. Rampi et al., Appl. Phys. Lett. 72, 1781 (1998); K. Slowinski et al., J. Am. Chem. Soc. 119, 11910 (1997)], (2) dielectric constants of 2.88 and 2.98 are obtained for biphenyl and p-terphenyl crystals using microwave cavity perturbation method [I. Kikujiro et al., Bull. Chem. Soc. Jpn. 46, 3385 (173)] (3) a dielectric constant of 3.9 is predicted for the TPT-SAM using first-principles density functional theory (DFT) calculations [H. Heitzer et al., ACS Nano 8, 12587 (2014)].

Figure 8D:
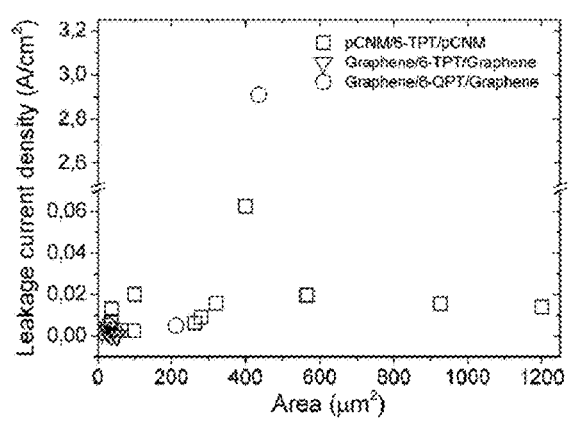
FIG. 8D illustrates the leakage current density as a function of the capacitor area for the different types of capacitors.

FIG. 8D shows the leakage current density determined from the obtained resistance $R_p$ at a bias voltage of 1V. In general, the leakage current densities range from 0.5 to 5 mA/cm² for graphene/CNM/graphene nanocapacitors and from 2.5 to 20 mA/cm² for pCNM/CNM/pCNM nanocapacitors. Some capacitors exhibit much higher leakage current densities, which is mainly attributed to the presence of defects.

An average capacitance density of 0.30±0.06 μF/cm² is obtained for the measured capacitors. To calculate the energy density, the capacitor is treated as a parallel plate capacitor and only the weight of the dielectric and both electrodes having the same areal dimension is considered. The energy density and power density are 0.029 W·h/kg (0.19 J/cm³) and 6.4×10⁵ W/kg, respectively, for a 26 μm² graphene/6-TPT/graphene capacitor at a working voltage of 1.0 V. The two values fall within the range associated with conventional dielectric capacitors. In contrast, the energy density and power density are 0.135 W·h/kg (0.66 J/cm³) and 1.4×10⁷ W/kg, respectively, for a 100 μm² pCNM/6-TPT/pCNM capacitor at a working voltage of 3.5 V. The difference between the two types of the capacitors is mainly due to a higher working voltage of pCNM/CNM/pCNM capacitors compared to that of graphene/CNM/graphene capacitors, despite that the former possess thicker electrodes.

Figure 9A:
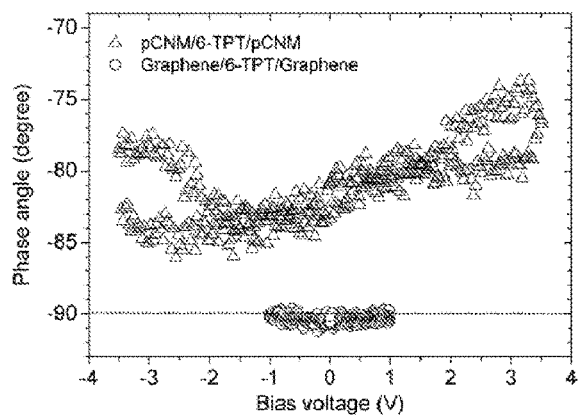
FIG. 9A illustrates a phase angle of the two types of capacitors as a function of the bias voltage.

FIG. 9A compares the effect of the DC bias voltage on the two types of capacitors: (1) the phase angles remain constant at −90° for the graphene/6-TPT/graphene capacitor up to a bias voltage of ±1 V; (2) the phase angles fluctuate between −85° and −75° for the pCNM/6-TPT/pCNM capacitor up to a bias voltage of ±3.5 V. However, some of the capacitors exhibit asymmetric characteristics when a sweep from negative to positive DC voltages is performed, i.e. the highest impedance magnitude is not located at 0 V, but in the range of 10-100 mV. This asymmetry can be accounted for by asymmetric configurations of the device and thus the charge impurities of graphene are screened differently for the bottom electrode (CNM/bottom-graphene/SiO₂) and the top electrode (air/top-graphene/CNM).

To quantify the dispersive behavior of the capacitors, the dependent of the capacitance on the bias voltage was measured and the Voltage Coefficients of Capacitance (VCCs) are determined by using the following equation:

$$C(V)=C_0(\alpha V^2+\beta V+1) \qquad (3)$$

where $C_0$ is the capacitance at zero bias, and α and β are the quadratic and linear coefficients of the capacitor.

Figure 9B:
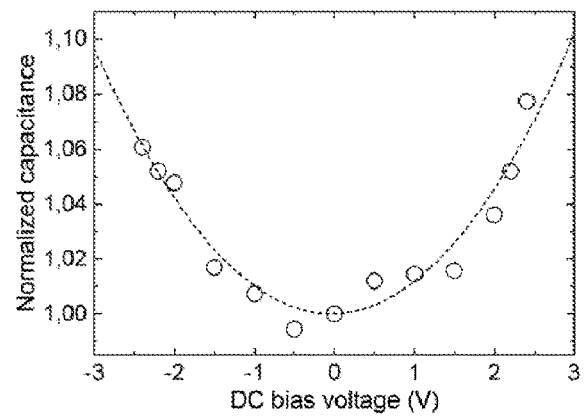
FIG. 9B illustrates a dispersive behavior of a graphene/CNM/graphene capacitor shown in a plot of the normalized capacitance as a function of DC bias voltages.
Figure 9C:
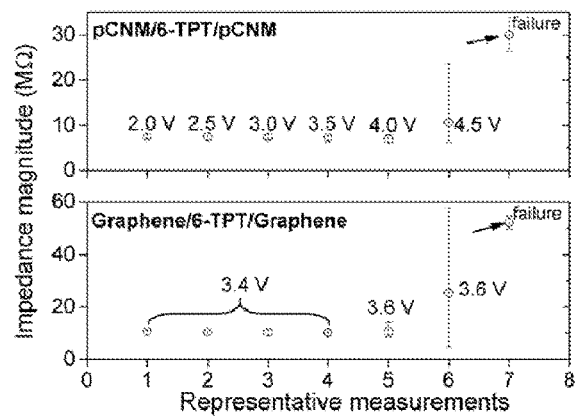
FIG. 9C illustrates a high DC bias voltage cause large fluctuations in the impedance and lead to the failure of the two types of capacitors.

FIG. 9B shows the normalized capacitance of a graphene/6-TPT/graphene capacitor as a function of the DC bias voltages. Values of 0.011 V$^{-2}$ for α and 8.6×10$^{-4}$ V$^{-1}$ for β, were extracted. The obtained α is about twice the value for α of HfO$_2$-based MIM capacitors and 7 times higher than that of Al$_2$O$_3$-based MIM capacitors. To further compare the effect of the DC bias voltage on the performance of the two types of capacitors, FIG. 9C presents the variation of the impedance magnitude as a result of the applied DC bias voltage. It can be seen that the impedance of the graphene/CNM/graphene capacitor changes dramatically at a bias voltage of 3.6 V, which leads to a sudden failure of the CNM dielectric. However, the impedance of the pCNM/CNM/pCNM capacitor shows a remarkable fluctuation at 4.5 V, which leads to a sudden failure of the pCNM electrode. For both types of capacitors, failure mode is associated with pronounced hysteresis loops, which may arise from the local rearrangement of the charge distribution at interfaces and/or electrodes.

Figure 9D:
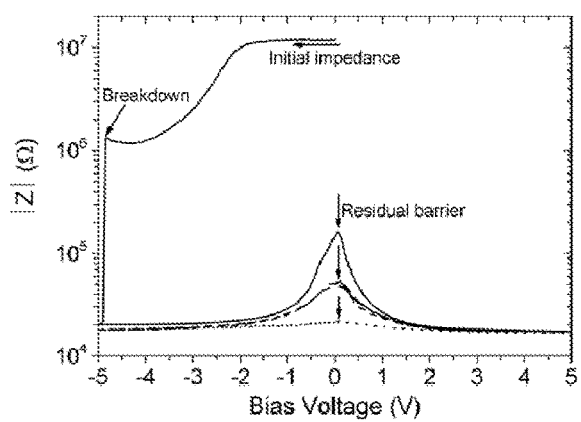
FIG. 9D illustrates a breakdown of a graphene/CNM/graphene capacitor occurs at −4.8 V, after which a small residual barrier can be seen at 0 V.

The dielectric breakdown of the capacitors was investigated by applying a variable DC bias voltage superimposed by an AC signal of 50 mV at 100 kHz and monitoring a sudden change in the impedance magnitude and its phase angle. The obtained signal is actually a measure of the first derivative of the I-V curve. It was found that pCNM/CNM/pCNM capacitors can withstand DC voltages up to 7 V, above which the capacitor becomes an open device. Inspection of some failed capacitors leads to the finding that the bottom pCNM electrodes become insulating, which is associated with a color change. For the graphene/CNM/graphene capacitors, the breakdown occurs at the dielectric part and the corresponding breakdown voltage was determined to be 4.6±0.2 V. A breakdown voltage of 0.68 V was reported for a Hg-BPT-SAM/BPT-SAM-Ag molecular junctions [R. Haag et al., J. Am. Chem. Soc. 121, 7895 (1999)]. This value indicates a good agreement with our measurements, as there are 4 phenyl rings and 1 interface across a Hg-BPT-SAM/BPT-SAM-Ag junction and 24 phenyl rings and 7 interfaces across the graphene/6-layer-CNM/graphene capacitor, leading to a 7 times higher breakdown voltage. Moreover, the method allows to gain insights into two possible breakdown processes: (1) the capacitor is completely shorted and then its frequency response resembles that of graphene electrodes; (2) the capacitor is not completely shorted, where a small residual barrier obtained at 0 V shows an exponential decay with increasing the maximum bias voltages until its complete disappearance, as shown in FIG. 9D. If the full bias voltage is assumed to drop across the capacitor, the breakdown voltage corresponds to a dielectric strength of 4.1 MV/cm. However, if the interfacial capacitance is taken into account, the voltage drop across the CNM dielectric is estimated to be 3.6 V and thus an effective dielectric strength of 3.2 MV/cm is obtained. Notice that the dielectric strength determined is not only associated with the intrinsic strength of chemical bonding in the CNM, but also with the CNM-graphene interfaces and the topographic imperfections of electrodes. Local field enhancement at metallic and organic impurities, particularly on graphene electrodes, can initiate dielectric damages around irregularities and eventually lead to conduction paths through the CNM. The propagation of these conduction paths can be further associated with local decomposition of CNMs by joule heating, polarization, collision ionization and electromigration of residual metal ions on graphene.

REFERENCE NUMERALS

110 First layer
120 Second layer
130 Third layer
210 First two-layer structure
220 Second two-layer structure
410 Substrate
420 First layer (electrode)
430 Second layer (dielectric)
440 Third layer (electrode)
450 Contact pads
510 Si dioxide substrate
520 Monolayer graphene (first layer)
530 Monolayer CNM
540 Monolayer graphene (third layer)
550 Au contact pads
610 SiO$_2$/Si substrate
620 bottom electrode
630 dielectric layer
640 top electrode
651 bottom contact pads
652 top contact pads

What is claimed is:

1. A method of manufacture of a multilayer structure comprising a first layer, a second layer and a third layer, comprising the steps of:
   separately preparing the first layer and the third layer, wherein the first layer and the third layer each comprise at least one pyrolyzed carbon nanomembrane by the steps of:
   a) providing at least one substrate layer,
   b) adding carbon-containing compounds to a surface of the at least one substrate layer
   c) cross-linking of the carbon-containing compounds, thus forming at least one carbon nanomembrane on the surface of the at least one substrate layer,
   d) removing the at least one carbon nanomembrane from the at least one substrate layer,
   e) wherein either after method step c) or after method step d) the method further comprises pyrolyzing the carbon nanomembrane to form a pyrolyzed carbon nanomembrane, thus separately forming the first layer and the third layer,
   preparing the second layer comprising at least one carbon nanomembrane by the steps of:
   i) providing a substrate layer,
   ii) adding carbon-containing compounds to a surface of the substrate layer
   iii) cross-linking of the carbon-containing compounds, thus forming the at least one carbon nanomembrane on the surface of the substrate layer,
   iv) removing the at least one carbon nanomembrane from the substrate layer,
   forming the multilayer structure by applying the second layer onto a surface of the first layer and applying the third layer onto a surface of the second layer.

2. The method according to claim 1, wherein at least one of the first layer or the third layer comprise a plurality of pyrolyzed carbon nanomembranes formed by steps a) to e) and layering the plurality of pyrolyzed carbon nanomembranes on top of each other, thus separately forming the at least one of the first layer and the third layer.

3. The method according to claim 1, wherein at least one of the first layer or the third layer comprise a plurality of carbon nanomembranes formed by the steps a) to d), layering the plurality of carbon nanomembranes on top of each other, and subsequently pyrolyzing according to step e) the plurality of carbon nanomembranes to form a pyrolyzed carbon nanomembrane, thus separately forming the at least one of the first layer and the third layer.

4. The method according to claim 1, wherein the second layer comprises a plurality of carbon nanomembranes formed by the steps i) to iv), and subsequently layering the plurality of carbon nanomembranes on top of each other.

5. The method according to claim 1, wherein the second layer comprises a plurality of carbon nanomembranes formed by the steps i) to iv), wherein after the step iii), the steps ii) and iii) are repeated to thereby obtain the plurality of carbon nanomembranes on the surface of the substrate layer, which are layered onto one another, and in the step iv), the more than one carbon nanomembrane is removed from the substrate.

6. The method according to claim 1, wherein the forming of the multilayer structure comprises layering the first layer, the second layer and the third layer onto one another.

7. The method according to claim 1, further comprising functionalizing at least one of a plurality of surfaces of the carbon nanomembrane or the surfaces of the pyrolyzed carbon nanomembrane.

8. The method according to claim 1, wherein the functionalizing is performed by chemical lithography.

9. The method according to claim 1, wherein the multilayer structure is a capacitor.

10. A method of manufacture of an all-carbon capacitor comprising a first carbon layer, a second carbon layer and a third carbon layer, the method comprising the steps of:
separately preparing the first carbon layer and the third carbon layer;
transferring the first carbon layer to a first substrate and patterning the first carbon layer on the substrate to form bottom electrodes;
transferring the second carbon layer onto the bottom electrodes;
transferring the third carbon layer to a third substrate and patterning the third carbon layer on the third substrate to form top electrodes; and
transferring the top electrodes to the second carbon layer.

11. The method of claim 10, wherein at least one of the first carbon layer or the third carbon layer is one of a graphene sheet or a pyrolyzed carbon nanomembrane.

12. The method of claim 10, wherein the patterning of at least one of the top electrodes or the bottom electrodes is carried out by at least one of electron beam lithography or reactive in etching.

13. The method of claim 10, wherein at least one of the first carbon layer or the second carbon layer is one of a multilayer of graphene or a multilayer of pyrolyzed carbon nanomembranes.

14. The method of claim 10, wherein the patterning of the top electrodes comprises forming parallel ribbons.

15. The method of claim 10, wherein the transferring of the top electrodes to the second carbon layer comprises releasing the top electrodes from the third substrate and transferring individual parts of the third carbon layer to the surface of the second carbon layer.

16. The method of claim 10, further comprising annealing of the first carbon layer and the second carbon layer.

17. The method of claim 10, wherein the second carbon layer is patterned.

18. The method of claim 10, wherein the second carbon layer is formed of cross-linked carbon-containing compounds.

19. The method of claim 10, wherein the second carbon layer is formed of a plurality of layers of cross-linked carbon-containing compounds.

* * * * *